(12) United States Patent
Matsumura et al.

(10) Patent No.: US 12,144,107 B2
(45) Date of Patent: Nov. 12, 2024

(54) SUBSTRATE CONNECTION STRUCTURE AND VEHICLE WIRING MODULE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Nobuyuki Matsumura, Mie (JP); Shinichi Takase, Mie (JP); Hiroki Shimoda, Mie (JP); Taiji Yanagida, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 187 days.

(21) Appl. No.: 17/928,157

(22) PCT Filed: May 28, 2021

(86) PCT No.: PCT/JP2021/020350
§ 371 (c)(1),
(2) Date: Nov. 28, 2022

(87) PCT Pub. No.: WO2021/251170
PCT Pub. Date: Dec. 16, 2021

(65) Prior Publication Data
US 2023/0247760 A1    Aug. 3, 2023

(30) Foreign Application Priority Data
Jun. 12, 2020   (JP) .................................. 2020-102106

(51) Int. Cl.
H05K 1/02        (2006.01)
B60R 16/02       (2006.01)
H05K 1/14        (2006.01)

(52) U.S. Cl.
CPC ....... H05K 1/0277 (2013.01); B60R 16/0215 (2013.01); H05K 1/14 (2013.01)

(58) Field of Classification Search
CPC .......................... H05K 1/0277; B60R 16/0215
(Continued)

(56) References Cited

U.S. PATENT DOCUMENTS

| 2006/0152406 A1* | 7/2006 | Leblanc | .................. H01P 5/107 |
| | | | 342/175 |
| 2011/0255850 A1* | 10/2011 | Dinh | ....................... B41F 17/00 |
| | | | 396/176 |

FOREIGN PATENT DOCUMENTS

| JP | 63-178373 | 11/1988 |
| JP | 05-095175 | 4/1993 |

(Continued)

OTHER PUBLICATIONS

International Search Report issued in International Bureau of WIPO Patent Application No. PCT/JP2021/020350, dated Aug. 10, 2021, along with an English translation thereof.

*Primary Examiner* — Andargie M Aychillhum
(74) *Attorney, Agent, or Firm* — Greenblum & Bernstein, P.L.C.

(57) ABSTRACT

A wiring module 20 is included in a power storage module 2 including a plurality of power storage elements 10 each having electrode terminals 11A and 11B and is connected to the power storage elements 10. The wiring module 20 includes a flexible FPC 21A including a first conductive path 23 and a circuit board 30 including a second conductive path that is electrically connected to the first conductive path 23. The FPC 21A includes a main body portion 24 and a circuit (Continued)

connecting portion 27 that extends from the main body portion 24 and is overlaid on the circuit board 30. The first conductive path 23 includes a first land 23A included in the circuit connecting portion 27. The second conductive path includes a second land 32A that is electrically connected to the first land 23A. The connected portion between the first land 23A and the second land 32A is covered by a covering portion 60 constituted by a resin having insulating properties.

5 Claims, 17 Drawing Sheets

(58) Field of Classification Search
USPC .......................................................... 361/749
See application file for complete search history.

(56) References Cited

FOREIGN PATENT DOCUMENTS

| | | |
|---|---|---|
| JP | 07-221427 | 8/1995 |
| JP | 08-274438 | 10/1996 |
| JP | 2007-227856 | 9/2007 |
| JP | 2013-251294 | 12/2013 |
| WO | 2020/026577 | 2/2020 |

\* cited by examiner

SUBSTRATE CONNECTION STRUCTURE
AND VEHICLE WIRING MODULE

TECHNICAL FIELD

The present specification discloses technology relating to a substrate connection structure and a vehicle wiring module.

BACKGROUND ART

A battery module for an electric vehicle or a hybrid vehicle includes a case body, a plurality of battery cells housed in the case body, and a flexible circuit board electrically connected to these battery cells. The flexible circuit board includes a substrate main body portion that is housed in the case body and a drawn-out substrate portion that is continuous from the substrate main body portion, drawn to the outside of the case body, and connected to an external device. The case body includes a through hole for drawing out the drawn-out substrate portion to the outside of the case body. A plug member that fits in the through hole and seals a gap between the case body and the drawn-out substrate portion is fixed to the drawn-out substrate portion. The plug member prevents intrusion of water into the case body.

CITATION LIST

Patent Documents

Patent Document 1: WO 2020/026577

SUMMARY OF INVENTION

Technical Problem

However, in the configuration described above, the inside of the case body needs to be completely waterproofed with the plug member serving as a boundary, and thus the structure becomes large and complex and the number of components increases.

Solution to Problem

A substrate connection structure disclosed in the present specification includes: at least one flexible substrate that includes a first conductive path and has flexibility; and a circuit board including a second conductive path that is electrically connected to the first conductive path, wherein the flexible substrate includes a main body portion and a circuit connecting portion that extends from the main body portion and is overlaid on the circuit board, the first conductive path includes a first land included in the circuit connecting portion, the second conductive path includes a second land that is connected to the first land, and a connected portion between the first land and the second land is covered by a covering portion that is constituted by a resin having an insulating property.

A vehicle wiring module disclosed in the present specification is included in a power storage module including a plurality of power storage elements having electrode terminals and is connected to the power storage elements, the vehicle wiring module including: a conductive member that is connected to the electrode terminals; at least one flexible substrate that has flexibility and includes a first conductive path that is electrically connected to the conductive member; and a circuit board including a second conductive path that is electrically connected to the first conductive path, wherein the flexible substrate includes a main body portion and a circuit connecting portion that extends from the main body portion and is overlaid on the circuit board, the first conductive path includes a first land included in the circuit connecting portion, the second conductive path includes a second land that is connected to the first land, and a connected portion between the first land and the second land is covered by a covering portion that is constituted by a resin having an insulating property.

Advantageous Effects of Invention

According to the substrate connection structure and the vehicle wiring module disclosed in the present specification, it is possible to simplify the structure and reduce the number of components while ensuring waterproofness and dustproofness.

DESCRIPTION OF EMBODIMENTS

Figure 1:
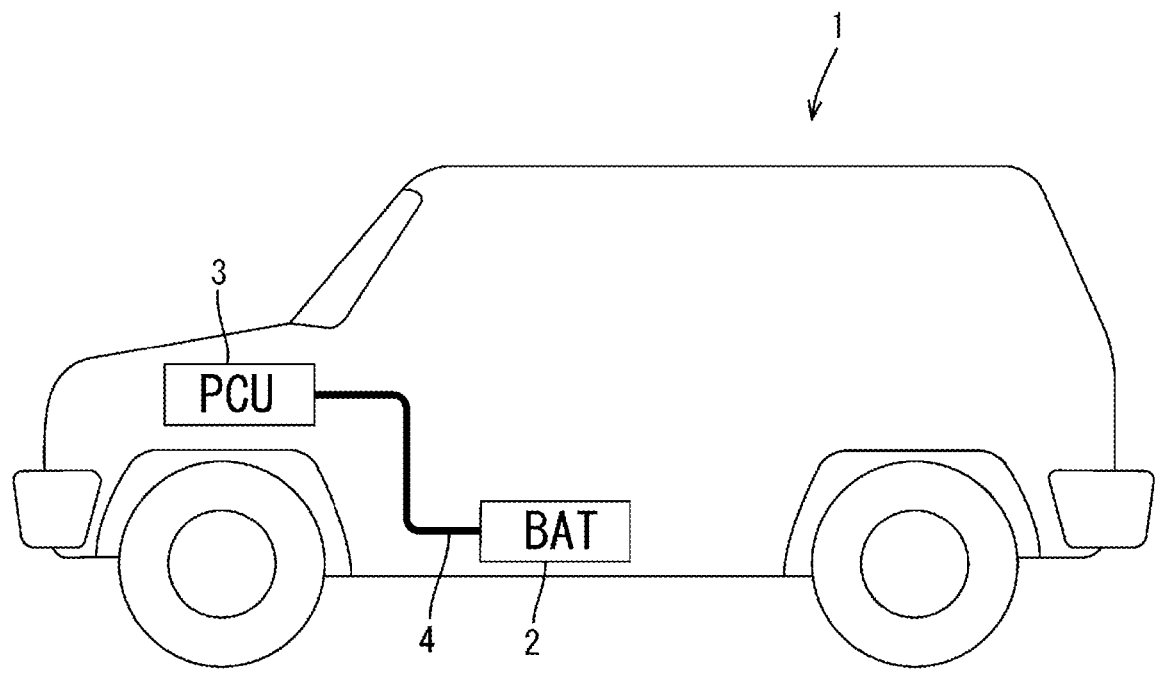
FIG. 1 is a schematic diagram showing a vehicle in which a power storage module according to Reference example 1 is mounted.

Overview of Embodiments (1) A substrate connection structure disclosed in the present specification includes: at least one flexible substrate that includes a first conductive path and has flexibility; and a circuit board including a second conductive path that is electrically connected to the first conductive path. The flexible substrate includes a main body portion and a circuit connecting portion that extends from the main body portion and is overlaid on the circuit board. The first conductive path includes a first land included in the circuit connecting portion. The second conductive path includes a second land that is connected to the first land. A connected portion between the first land and the second land is covered by a covering portion that is constituted by a resin having an insulating property.

A vehicle wiring module disclosed in the present specification is included in a power storage module including a plurality of power storage elements having electrode terminals, and is connected to the power storage elements. The vehicle wiring module includes: a conductive member that is connected to the electrode terminals; at least one flexible substrate that has flexibility and includes a first conductive path that is electrically connected to the conductive member; and a circuit board including a second conductive path that is electrically connected to the first conductive path. The flexible substrate includes a main body portion and a circuit connecting portion that extends from the main body portion and is overlaid on the circuit board. The first conductive path includes a first land included in the circuit connecting portion. The second conductive path includes a second land that is connected to the first land. A connected portion between the first land and the second land is covered by a covering portion that is constituted by a resin having an insulating property.

According to the above configurations, waterproofing and dustproofing procedures can be predominantly performed on the electrically connected portion between the flexible substrate and the circuit board, particular for which short-circuiting is of concern. Therefore, the flexible substrate and the circuit board do not necessarily need to be entirely configured to be waterproof and dustproof, and the configuration can be simplified and the number of components can be reduced.

(2) In the above configuration, the substrate connection structure may further include an adhesive layer that has adhesiveness and is interposed between the circuit connecting portion and the circuit board.

According to this configuration, the electrically connected portion between the flexible substrate and the circuit board can be more reliably protected from water and dust by bonding the circuit connecting portion to the circuit board with use of the adhesive layer and covering the electrically connected portion with the covering portion. Also, the circuit connecting portion can be temporarily fixed to the circuit board in a state of being positioned relative to the circuit board with use of the adhesive layer before the covering portion is formed. This facilitates work for forming the covering portion.

(3) In the above configurations, the circuit connecting portion may include: a stacked portion that is overlaid on the circuit board; a base end portion that is an intermediate portion between the stacked portion and a boundary position between the circuit connecting portion and the main body portion; and a bent portion that is bent at a boundary position between the base end portion and the stacked portion.

According to this configuration, the work for forming the covering portion can be performed in a state where the base end portion is raised forming an angle relative to the stacked portion. Therefore, the covering portion can be easily formed over the entire circumference of the stacked portion, and the electrically connected portion between the flexible substrate and the circuit board can be more reliably protected from water and dust.

(4) In the configuration described above in (2), the circuit connecting portion may include: a stacked portion that is overlaid on the circuit board; a base end portion that is an intermediate portion between the stacked portion and a boundary position between the circuit connecting portion and the main body portion; and a bent portion that is bent at a boundary position between the base end portion and the stacked portion, and the adhesive layer may be provided between the stacked portion and the circuit board and may be adjacent to the bent portion.

According to this configuration, even if the material of the covering portion is stopped by the base end portion during formation of the covering portion and does not sufficiently flow into the base end portion side region in the surrounding region of the stacked portion, the adhesive layer prevents water and dust from entering via this region. Therefore, it is possible to ensure waterproofness and dustproofness in the electrically connected portion between the flexible substrate and the circuit board.

(5) In the configuration described above in (3) or (4), the substrate connection structure may further include a holding member that is fixed to the circuit board and holds the base end portion.

According to this configuration, the base end portion is held by the holding portion, and accordingly, the state where the base end portion is raised relative to the stacked portion can be maintained during formation of the covering portion. Therefore, the covering portion can be more easily formed over the entire circumference of the stacked portion, and the electrically connected portion between the flexible substrate and the circuit board can be more reliably protected from water and dust.

(6) In the above configuration, the substrate connection structure may further include a surrounding member that is fixed to the circuit board and surrounds the covering portion.

According to this configuration, an outer edge of the covering portion is defined by the surrounding portion, and accordingly, during formation of the covering portion, the material of the covering portion can be kept from flowing to the outside of the region in which the covering portion is to be formed, and the covering portion can be stably formed in an intended shape. Therefore, the electrically connected portion between the flexible substrate and the circuit board can be more reliably protected from water and dust.

(7) In the above configuration, the entire circumference of the connected portion between the first land and the second land may be covered by the covering portion.

According to this configuration, it is possible to reliably protect the electrically connected portion between the flexible substrate and the circuit board.

Details of Embodiments

The following describes specific examples of the technology disclosed in the present specification with reference to the drawings. However, the present invention is not limited to the following examples, but is defined by the claims, and is intended to encompass all modifications within the meanings and scope that are equivalent to the claims.

Reference Example 1

Reference example 1 will be described with reference to FIGS. 1 to 8. A substrate connection structure according to the present embodiment is a part of a vehicle wiring module 20 included in a power storage module 2. The power storage module 2 is mounted in a vehicle 1 such as an electric vehicle or a hybrid vehicle and is used as a power source for driving the vehicle 1. As shown in FIG. 1, the power storage module 2 is installed near the center of the vehicle 1. A PCU (Power Control Unit) 3 is installed in a front portion of the vehicle 1. The power storage module 2 and the PCU 3 are connected to each other via a wire harness 4.

[Power Storage Module 2]

Figure 2:
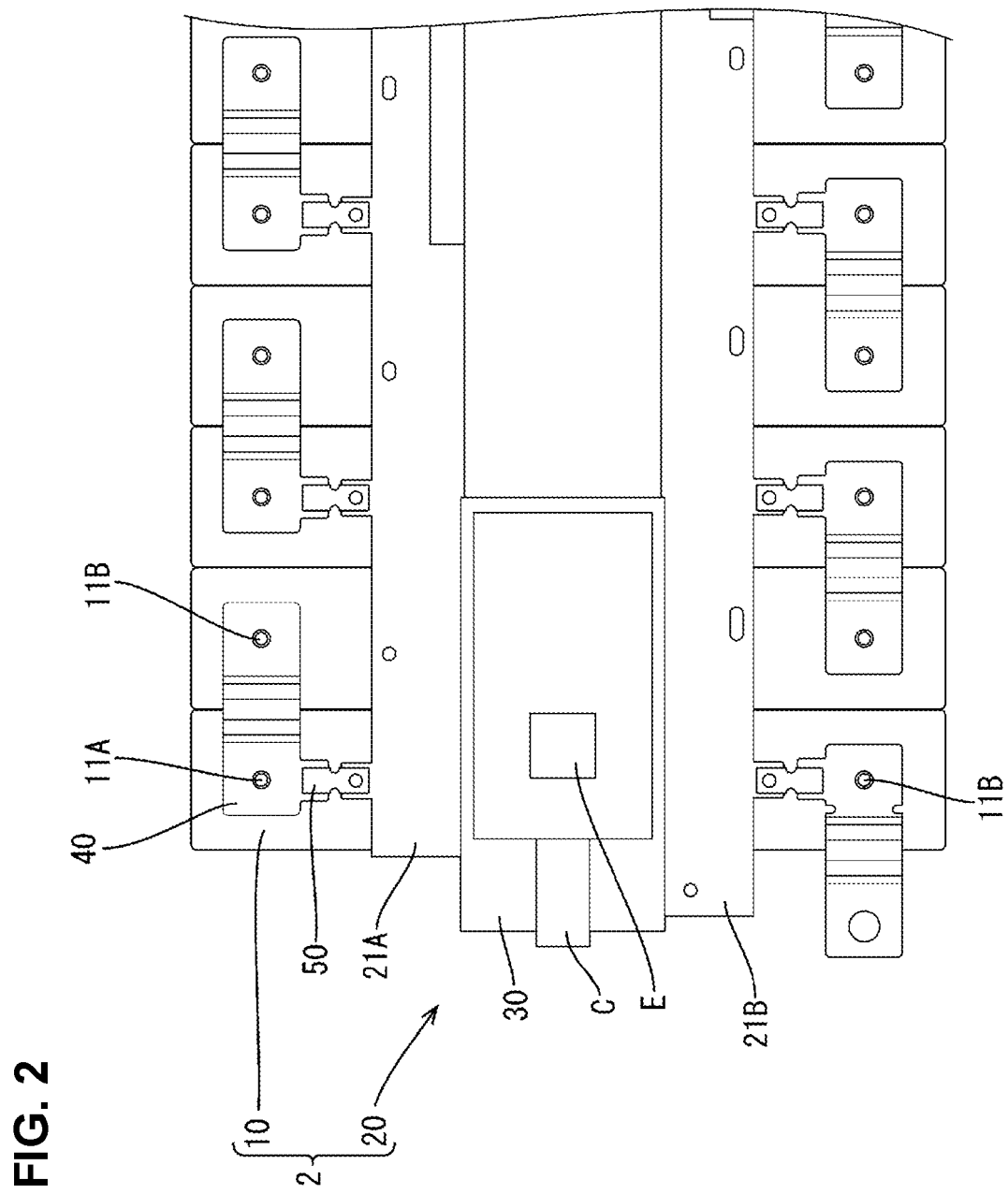
FIG. 2 is a partial enlarged plan view of a power storage module according to Reference example 1.

As shown in FIG. 2, the power storage module 2 includes a plurality of power storage elements 10 and the vehicle wiring module 20 attached to the power storage elements 10. The power storage elements 10 may be secondary batteries such as nickel-hydrogen secondary batteries or lithium ion secondary batteries, or capacitors. Each power storage element 10 includes electrode terminals 11A and 11B that form a pair including a positive terminal and a negative terminal. One of the electrode terminals 11A and 11B is the positive terminal 11A and the other is the negative terminal 11B. Two adjacent power storage elements 10 are arranged such that electrode terminals 11A and 11B of different polarities are adjacent to each other, i.e., the positive terminal 11A of one power storage element 10 is adjacent to the negative terminal 11B of another power storage element 10 adjacent to the one power storage element 10.

[Wiring Module 20 for Vehicle]

Figure 3:
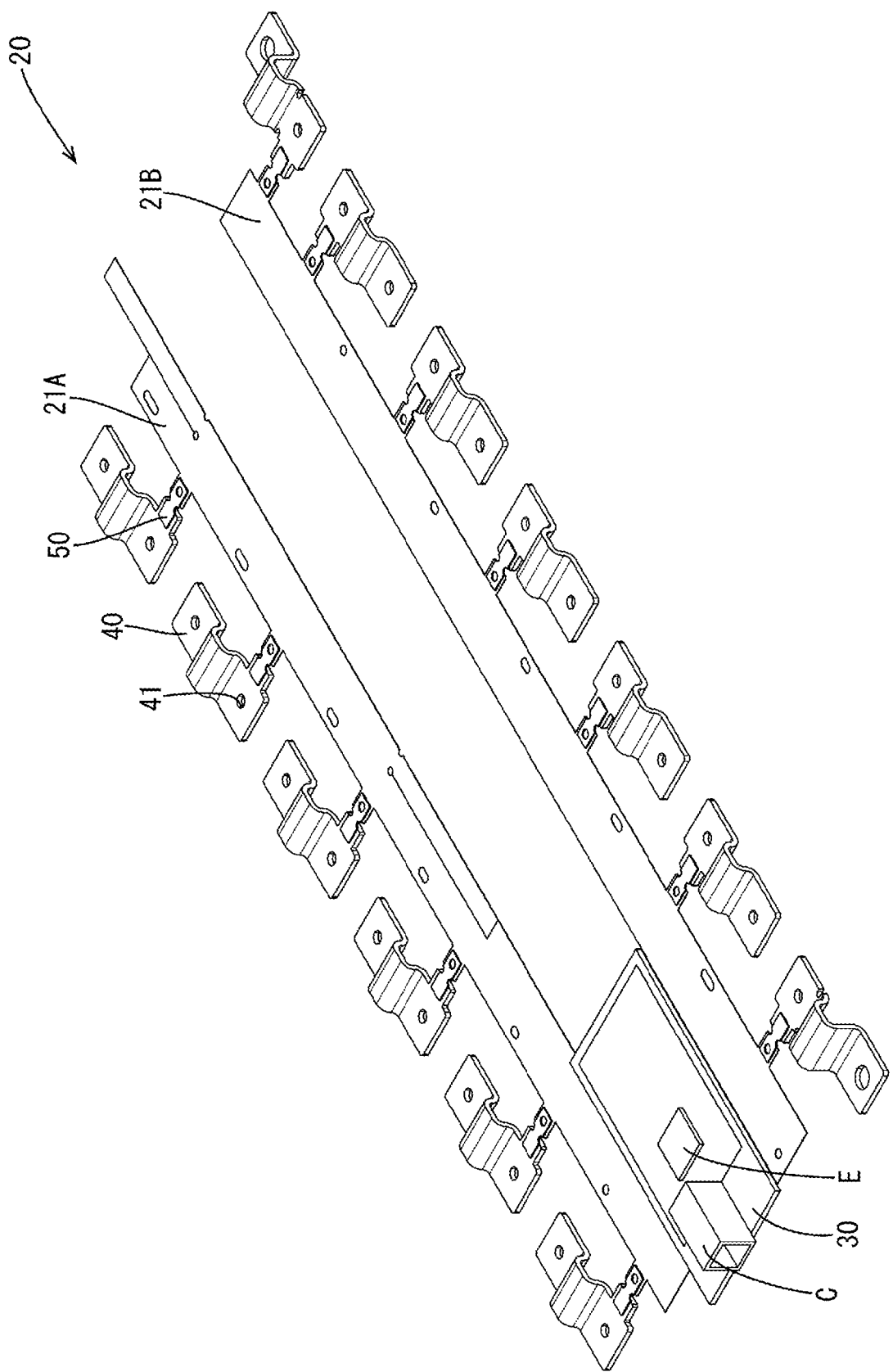
FIG. 3 is a perspective view of a wiring module according to Reference example 1.
Figure 5:
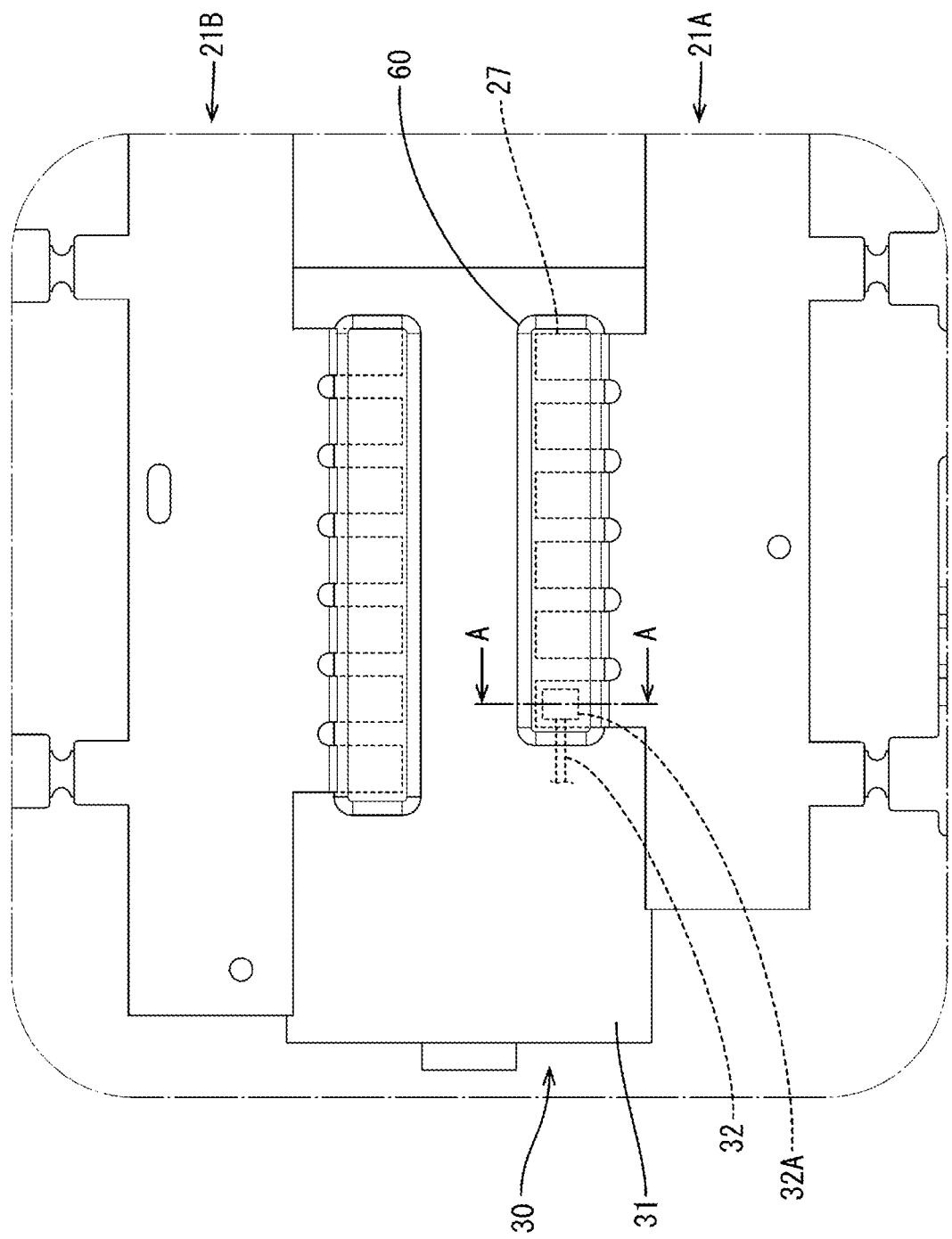
FIG. 5 is a partial enlarged bottom view of the wiring module according to Reference example 1.

As shown in FIGS. 2, 3, and 5, the vehicle wiring module (hereinafter abbreviated as "wiring module") 20 includes two flexible printed circuit boards (hereinafter abbreviated as "FPCs") 21A and 21B, a circuit board 30 that is connected to the FPCs 21A and 21B, bus bars 40 that are connected to the electrode terminals 11A and 11B of the power storage elements 10, relay members 50 connecting the FPCs 21A and 21B and the bus bars 40 (an example of a conductive member), and a covering portion 60 covering connected portions between the FPC 21A and the circuit board 30. Structures of the two FPCs 21A and 21B are the same except for details such as the shape of a terminal end portion, and therefore, the following describes the FPC 21A and a connection structure between the FPC 21A and the circuit board 30 in detail, and descriptions of the other FPC 21B are omitted with configurations equivalent to those of the FPC 21A denoted by the same reference numerals as those used for the FPC 21A.

[FPC 21A]

Figure 4:
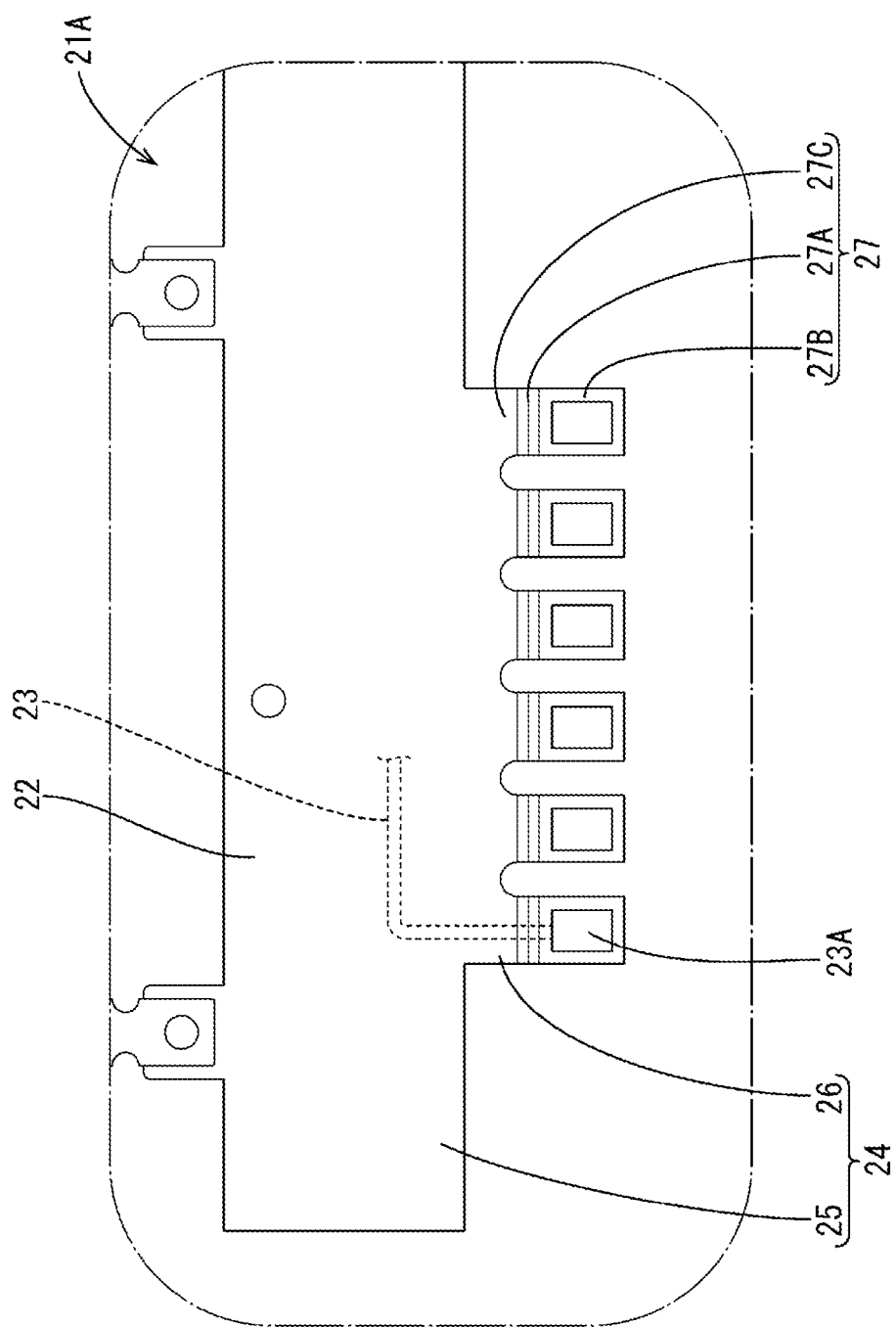
FIG. 4 is a partial enlarged plan view of a flexible printed circuit board according to Reference example 1.

The FPC 21A is a flexible sheet-shaped substrate and includes two insulation layers 22 having insulating properties and a plurality of first conductive paths 23 that are provided between the two insulation layers 22 and covered by the insulation layers 22 as shown in FIG. 4. The insulation layers 22 are formed using resin films that have insulating properties and flexibility. The first conductive paths 23 are made of metal such as copper or a copper alloy, for example, and have electrical conductivity. The first conductive paths 23 are formed in a predetermined pattern using a print wiring technique.

As shown in FIG. 4, the FPC 21A includes a band-shaped wiring portion 25, a connection base portion 26 that is continuous to the wiring portion 25, and a plurality of circuit connecting portions 27 extending from the connection base portion 26. The wiring portion 25 and the connection base portion 26 constitute a main body portion 24. The connection base portion 26 has an elongated rectangular shape and extends along a side of the wiring portion 25. Each of the plurality of circuit connecting portions 27 is formed as a rectangular plate piece and extends from the connection base portion 26. The plurality of circuit connecting portions 27 are arranged in a line along a side of the connection base portion 26.

End portions of the first conductive paths 23 that are located in the circuit connecting portions 27 serve as first lands 23A to be connected to the circuit board 30. Each circuit connecting portion 27 includes a first land 23A. The first lands 23A are exposed from an insulation layer 22. Note that the first conductive paths 23 include lands for bus bars, which are exposed from the insulation layer 22 and connected to the bus bars 40 via the relay members 50. FIG. 4 only shows the first lands 23A in the respective circuit connecting portions 27 and a portion of a first conductive path 23 that is continuous to one of the first lands 23A, and the other portions of the first conductive paths 23 are omitted to facilitate comprehension of the drawing, for example.

[Circuit Board 30]

Figure 6:
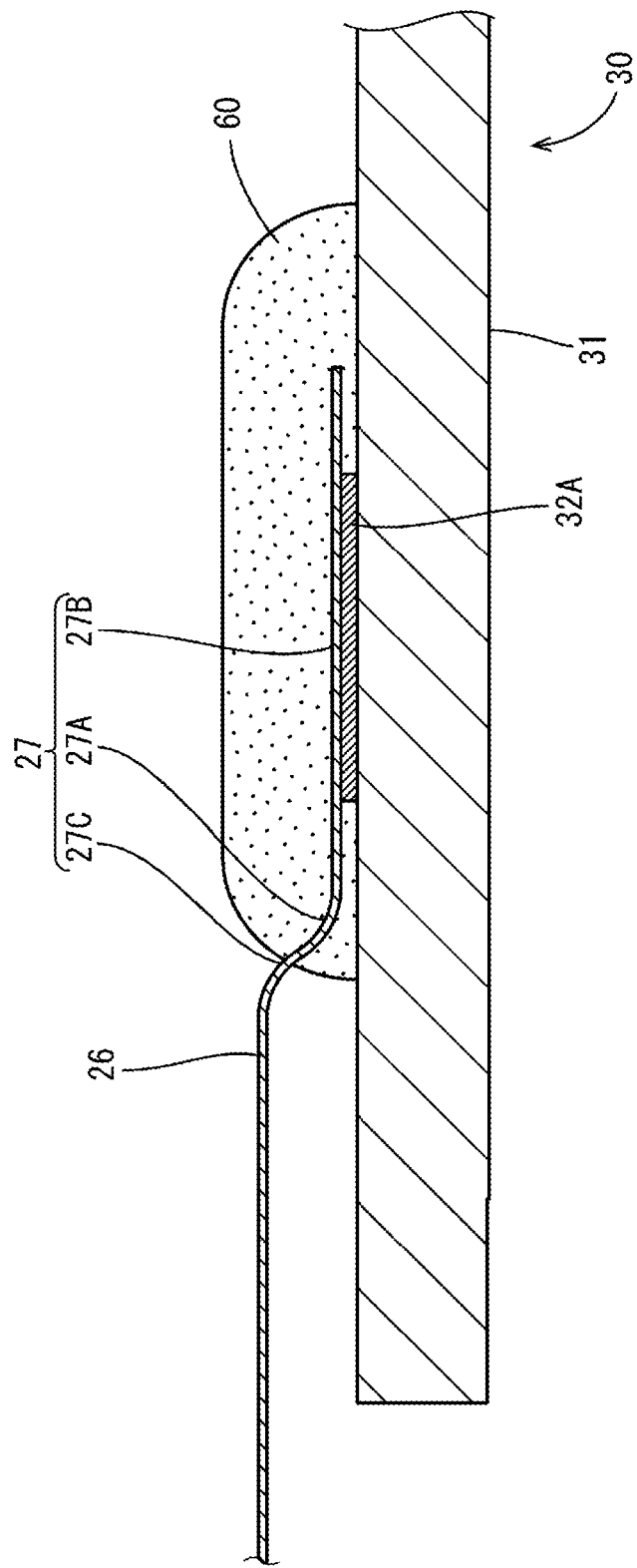
FIG. 6 is a cross-sectional view taken along line A-A in FIG. 5.

The circuit board 30 is a hard substrate that is not flexible, and includes an insulation plate 31 having insulating properties and a second conductive path 32 that is formed on a surface of the insulation plate 31 using a print wiring technique, as shown in FIGS. 5 and 6. The insulation plate 31 is formed by impregnating a glass fiber cloth with an epoxy resin and curing the epoxy resin, for example. The second conductive path 32 is made of metal such as copper or a copper alloy, for example, and has electrical conductivity. As shown in FIGS. 3 and 4, an electronic component E and a connector C to be connected to the PCU 3 are mounted on the other surface of the circuit board 30. Examples of the electronic component E include a microcomputer and a switching element. As shown in FIG. 5, a portion of the second conductive path 32 serves as second lands 32A to be connected to the first lands 23A of the FPC 21A. The plurality of second lands 32A are arranged in a line at positions corresponding to the first lands 23A of the FPC 21A. FIG. 5 only shows a second land 32A and a portion of the second conductive path 32 that is continuous to the second land 32A, and the other portions of the second conductive path 32 are omitted to facilitate comprehension of the drawing.

[Bus Bar 40]

The bus bars 40 are members for connecting the electrode terminals 11A and 11B of adjacent power storage elements 10 to each other and are formed using metal plates having electrical conductivity. Examples of the metal constituting the bus bars 40 include copper, a copper alloy, aluminum, an aluminum alloy, and stainless steel (SUS). As shown in FIGS. 2 and 3, each of the bus bars 40 has a rectangular plate shape as a whole and includes two electrode insertion holes 41 through which the electrode terminals 11A and 11B can be passed.

[Relay Member 50]

The relay members 50 are members for electrically connecting the first conductive paths 23 of the FPC 21A to the bus bars 40 and are formed using metal plates having electrical conductivity. Examples of the metal constituting the relay members 50 include copper, a copper alloy, aluminum, an aluminum alloy, stainless steel (SUS), nickel, and a nickel alloy. As shown in FIGS. 2 and 3, end portions on one side of the relay members 50 are overlaid on the FPC 21A and soldered to the lands for bus bars, and end portions on the other side of the relay members 50 are welded to the bus bars 40.

[Connection Structure Between FPC 21A and Circuit Board 30]

As shown in FIG. 6, each circuit connecting portion 27 is overlaid on the corresponding second land 32A and a portion of the circuit board 30 surrounding the second land 32A. As shown in FIGS. 4 and 6, each circuit connecting portion 27 is bent at a position that is slightly closer to the leading end of the circuit connecting portion 27 than a boundary position between the circuit connecting portion 27 and the connection base portion 26 is, and a portion of the circuit connecting portion 27 that is on the leading end side relative to the thus formed bent portion 27A is a stacked portion 27B that is overlaid on the circuit board 30. In other words, each circuit connecting portion 27 includes the stacked portion 27B overlaid on the circuit board 30, a base end portion 27C that is an intermediate portion between the stacked portion 27B and the boundary position between the circuit connecting portion 27 and the connection base portion 26, and the bent portion 27A that is bent at a boundary position between the base end portion 27C and the stacked portion 27B. The base end portion 27C extends at an angle relative to the stacked portion 27B and is spaced upward from the circuit board 30. The first land 23A is included in the stacked portion 27B, overlaid on the second land 32A, and electrically connected to the second land 32A with solder. Note that the FPC 21A is shown as a single layer in FIGS. 6, 7, and 8, and the insulation layers 22 and the first land 23A are not illustrated in detail to facilitate comprehension of the drawings.

As shown in FIGS. 5 and 6, most of the circuit connecting portion 27 and the second land 32A are covered by the covering portion 60 having insulating properties. The covering portion 60 is made of a synthetic resin material that has fluidity before being solidified and loses fluidity when solidified. An example of such a material is a potting material. The covering portion 60 has a dome-like external shape, and covers the entirety of the stacked portion 27B, the bent portion 27A, and the first land 23A. In other words, the second land 32A and the stacked portion 27B including the first land 23A are entirely embedded in the covering portion 60, and the entire circumference of the connected portion between the first land 23A and the second land 32A is covered by the covering portion 60. As shown in FIG. 5, in the present embodiment, the single covering portion 60 collectively covers the plurality of second lands 32A arranged in a line and the stacked portions 27B of the plurality of circuit connecting portions 27 connected to the second lands 32A.

[Steps for Connecting FPC 21A and Circuit Board 30]

Figure 7:
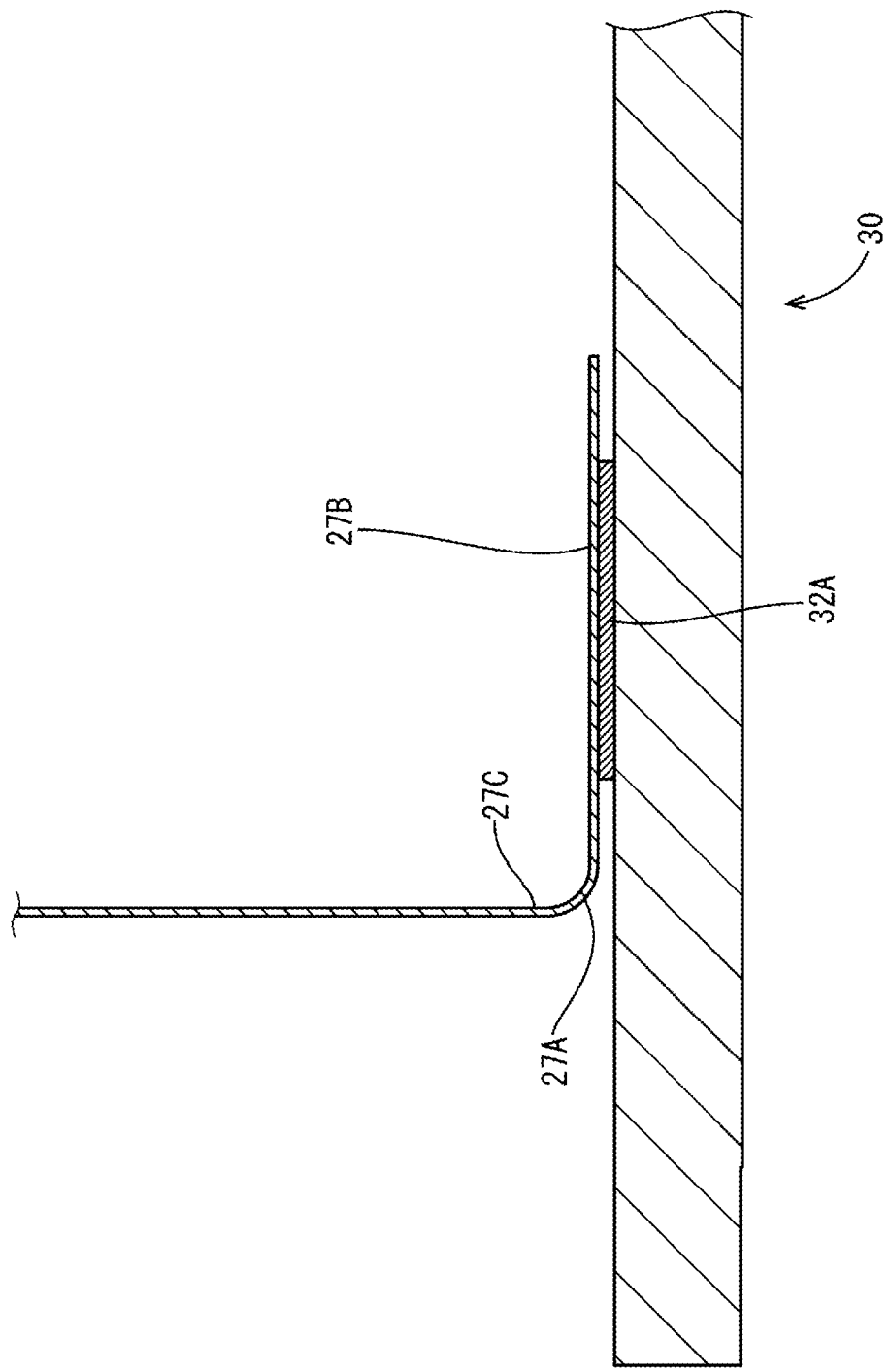
FIG. 7 is a partial enlarged cross-sectional view showing a state where a stacked portion is overlaid on a circuit board in Reference example 1 in a cross section cut at the same position as line A-A in FIG. 5.

Next, an example of steps for connecting the FPC 21A and the circuit board 30 will be described. First, the bent portion 27A is formed by bending the circuit connecting portion 27 at a position slightly closer to the leading end thereof than the boundary position between the circuit connecting portion 27 and the connection base portion 26 is. In the steps for connecting the FPC 21A and the circuit board 30, work is performed in a state where the base end portion 27C is raised to be substantially perpendicular to the stacked portion 27B so that the circuit connecting portion 27 forms a substantially L shape as shown in FIG. 7.

Next, a step for connecting the first land 23A and the second land 32A with solder is performed. First, solder cream is applied to the second land 32A of the circuit board 30 through screen printing, for example. Next, the stacked portion 27B of the circuit connecting portion 27 is overlaid on the circuit board 30 as shown in FIG. 7. At this time, each first land 23A is positioned to be overlaid on the solder cream applied to the corresponding second land 32A. Next, reflow processing is performed. As a result, the first land 23A and the second land 32A are electrically connected to each other by the solder. Thus, the first land 23A and the second land 32A are connected.

Next, a step for forming the covering portion 60 is performed. First, a potting material having fluidity is dripped onto the circuit board 30 using a nozzle or the like so as to bulge in a dome-like shape. After dripping is finished, the applied potting material is cured to form the covering portion 60. Thus, the covering portion 60 is formed.

Figure 8:
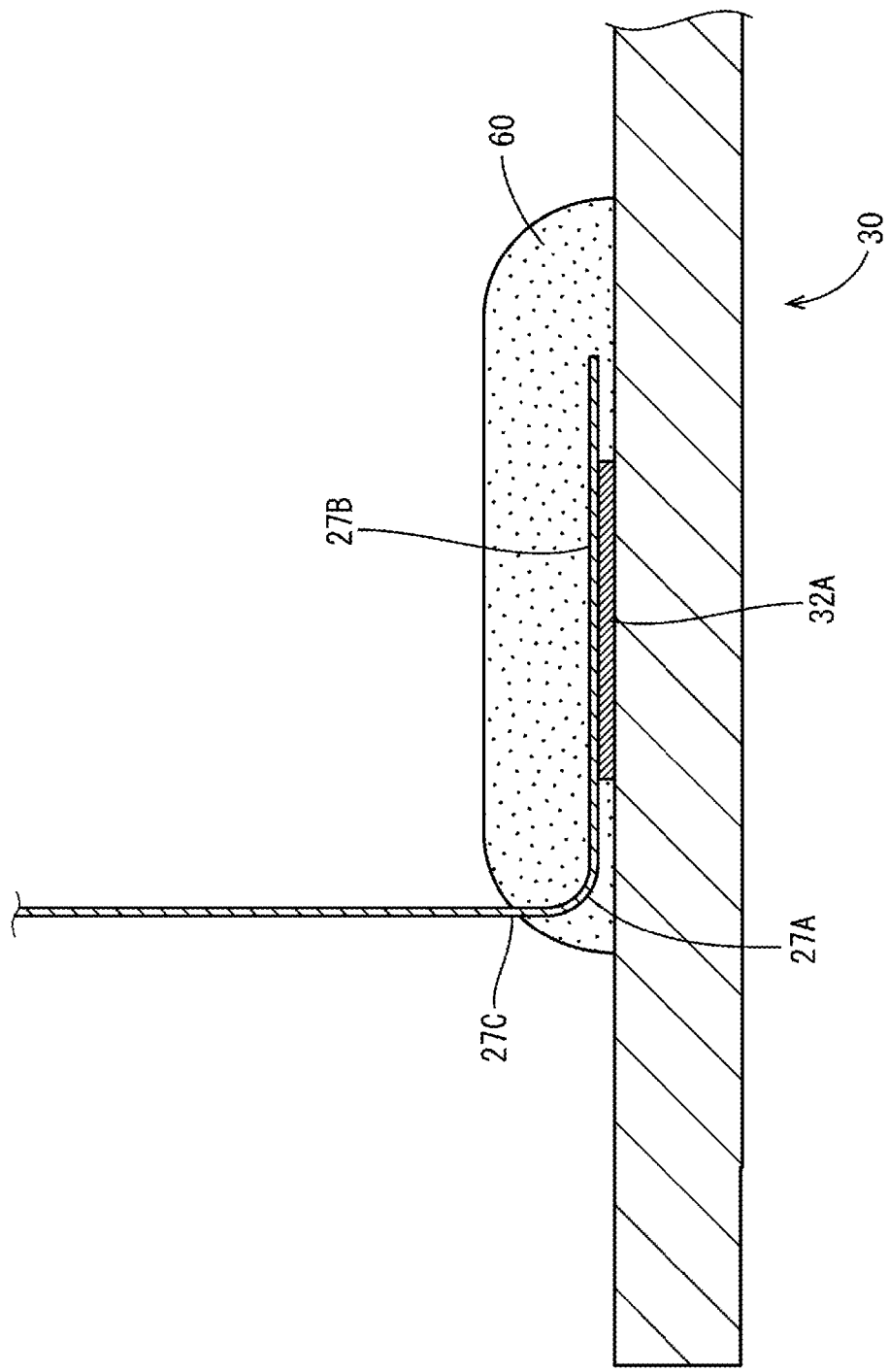
FIG. 8 is a partial enlarged cross-sectional view showing a state where a covering portion is formed in Reference example 1 in a cross section cut at the same position as line A-A in FIG. 5.

Here, if the circuit connecting portion 27 is not bent at the bent portion 27A, the potting material is unlikely to flow into a space between the circuit board 30 and a portion of the circuit connecting portion 27 adjacent to the connection base portion 26, and the covering portion 60 is unlikely to be formed in this space. Therefore, there is a concern that water or dust may enter the space and a short circuit may occur between the second lands 32A adjacent to each other. However, in the present embodiment, the circuit connecting portion 27 is bent at the bent portion 27A and work is performed in the state where the base end portion 27C is raised to be substantially perpendicular to the stacked portion 27B. Accordingly, the dripped potting material can easily flow into a base end portion 27C side region (region on the lower left side of the bent portion 27A in FIG. 8) in the surrounding region of the stacked portion 27B as shown in FIG. 8. Therefore, the entire circumference of the stacked portion 27B and the first land 23A can be reliably covered by the covering portion 60.

[Functions and Effects]

As described above, according to the present embodiment, the wiring module 20 is included in the power storage module 2 including the plurality of power storage elements 10 each having the electrode terminals 11A and 11B, and is connected to the power storage elements 10. The wiring module 20 includes the FPC 21A that includes the first conductive paths 23 and has flexibility and the circuit board 30 including the second conductive path 32 that is electrically connected to the first conductive paths 23. The FPC 21A includes the main body portion 24 and the circuit connecting portions 27 that extend from the main body portion 24 and are overlaid on the circuit board 30. The first conductive paths 23 include the first lands 23A included in the circuit connecting portions 27, the second conductive path 32 includes the second lands 32A connected to the first lands 23A, and connected portions between the first lands 23A and the second lands 32A are covered by the covering portion 60 that is constituted by a resin having insulating properties.

According to this configuration, waterproofing and dustproofing procedures can be predominantly performed on electrically connected portions between the FPC 21A and the circuit board 30, particularly for which short-circuiting is of concern. Therefore, the FPC 21A and the circuit board 30 do not necessarily need to be entirely configured to be waterproof and dustproof, and the configuration can be simplified and the number of components can be reduced.

Also, each circuit connecting portion 27 includes the stacked portion 27B overlaid on the circuit board 30, the base end portion 27C that is an intermediate portion between the stacked portion 27B and the boundary position between the circuit connecting portion 27 and the main body portion 24, and the bent portion 27A bent at the boundary position between the base end portion 27C and the stacked portion 27B.

According to this configuration, it is possible to perform the work for forming the covering portion 60 in the state where the base end portion 27C is raised forming an angle relative to the stacked portion 27B. Therefore, the covering portion 60 can be easily formed over the entire circumference of the stacked portion 27B, and the electrically connected portions between the FPC 21A and the circuit board 30 can be reliably protected from water and dust.

Also, the entire circumference of the connected portion between the first land 23A and the second land 32A is covered by the covering portion 60. According to this configuration, the electrically connected portions between the FPC 21A and the circuit board 30 can be reliably protected from water and dust.

Reference Example 2

Next, Reference example 2 will be described with reference to FIGS. 9 to 13. A wiring module 100 according to the present embodiment differs from that in Reference example 1 in that the wiring module 100 includes a frame member 110 (holding member, an example of a surrounding member) that is fixed to a circuit board 120 and surrounds a covering portion 130. Configurations in the present embodiment that are equivalent to those in Reference example 1 are denoted with the same reference signs as those used in Reference example 1, and descriptions thereof are omitted.

[Configuration of Wiring Module 100]

Figure 9:
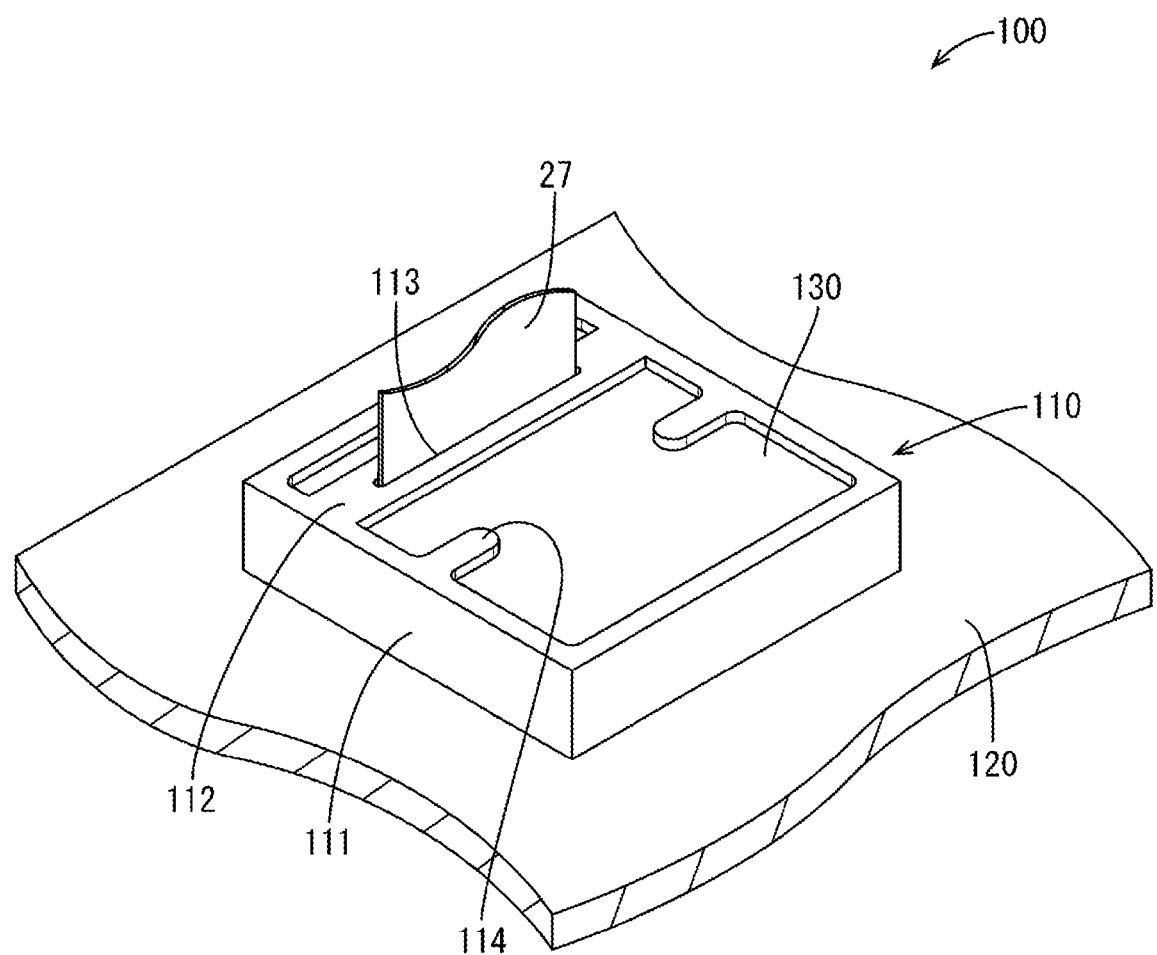
FIG. 9 is a partial enlarged perspective view of a wiring module according to Reference example 2.

As shown in FIG. 9, the frame member 110 includes a surrounding portion 111, a holding portion 112 that is continuous to the surrounding portion 111 and holds the circuit connecting portion 27, and two fixed portions 114 that are continuous to the surrounding portion 111 and are fixed to the circuit board 120.

Figure 10:
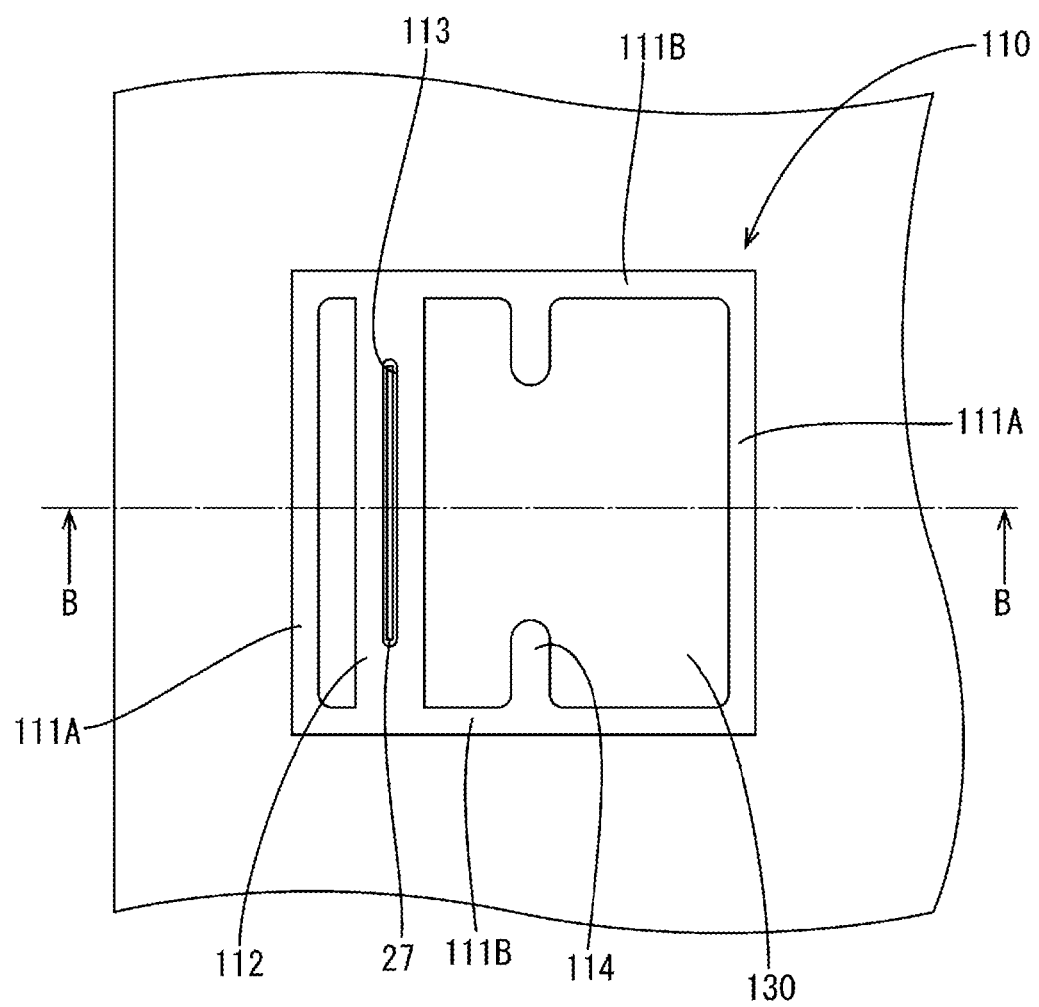
FIG. 10 is a partial enlarged plan view of the wiring module according to Reference example 2.
Figure 11:
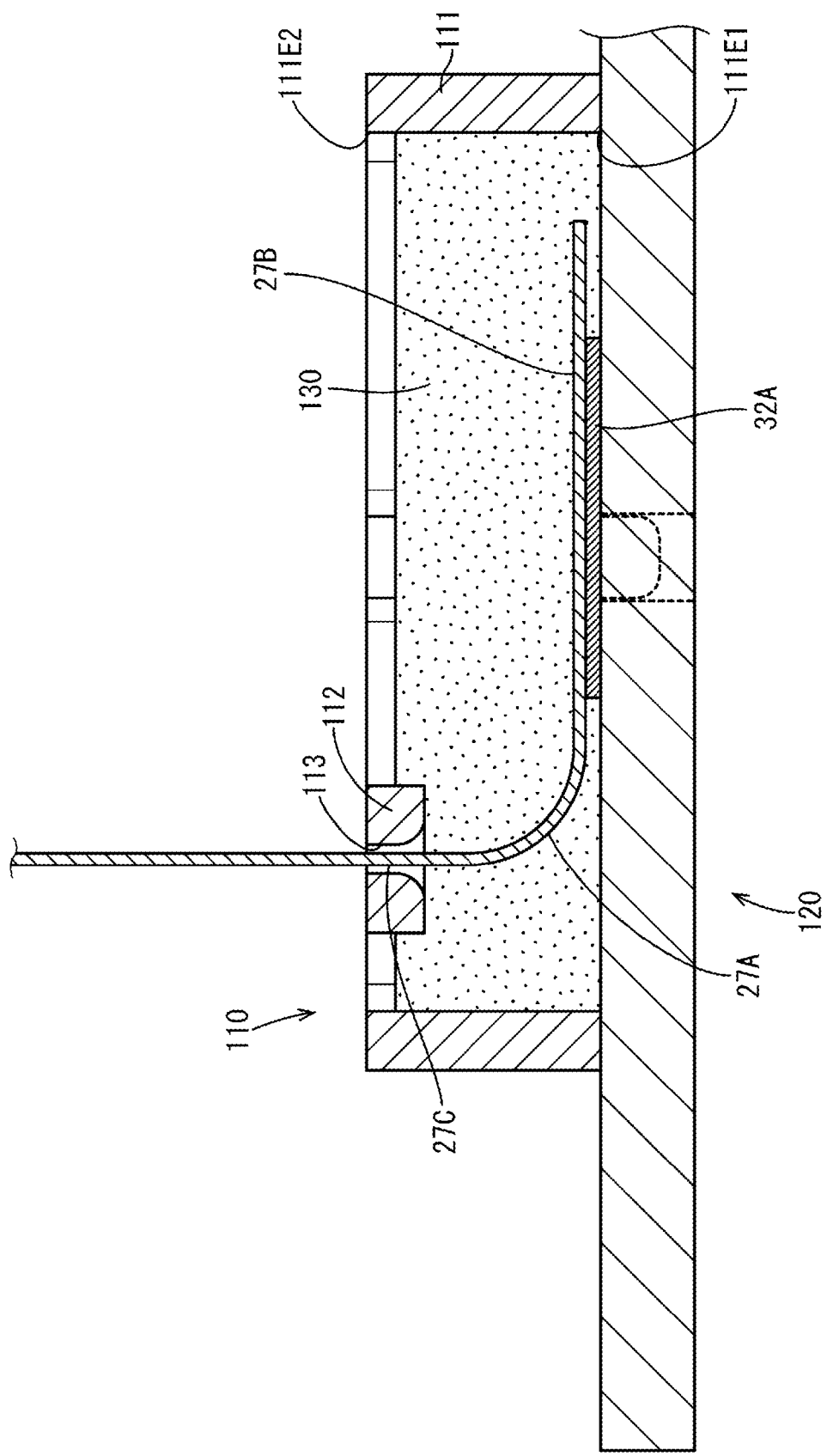
FIG. 11 is a cross-sectional view taken along line B-B in FIG. 10.
Figure 12:
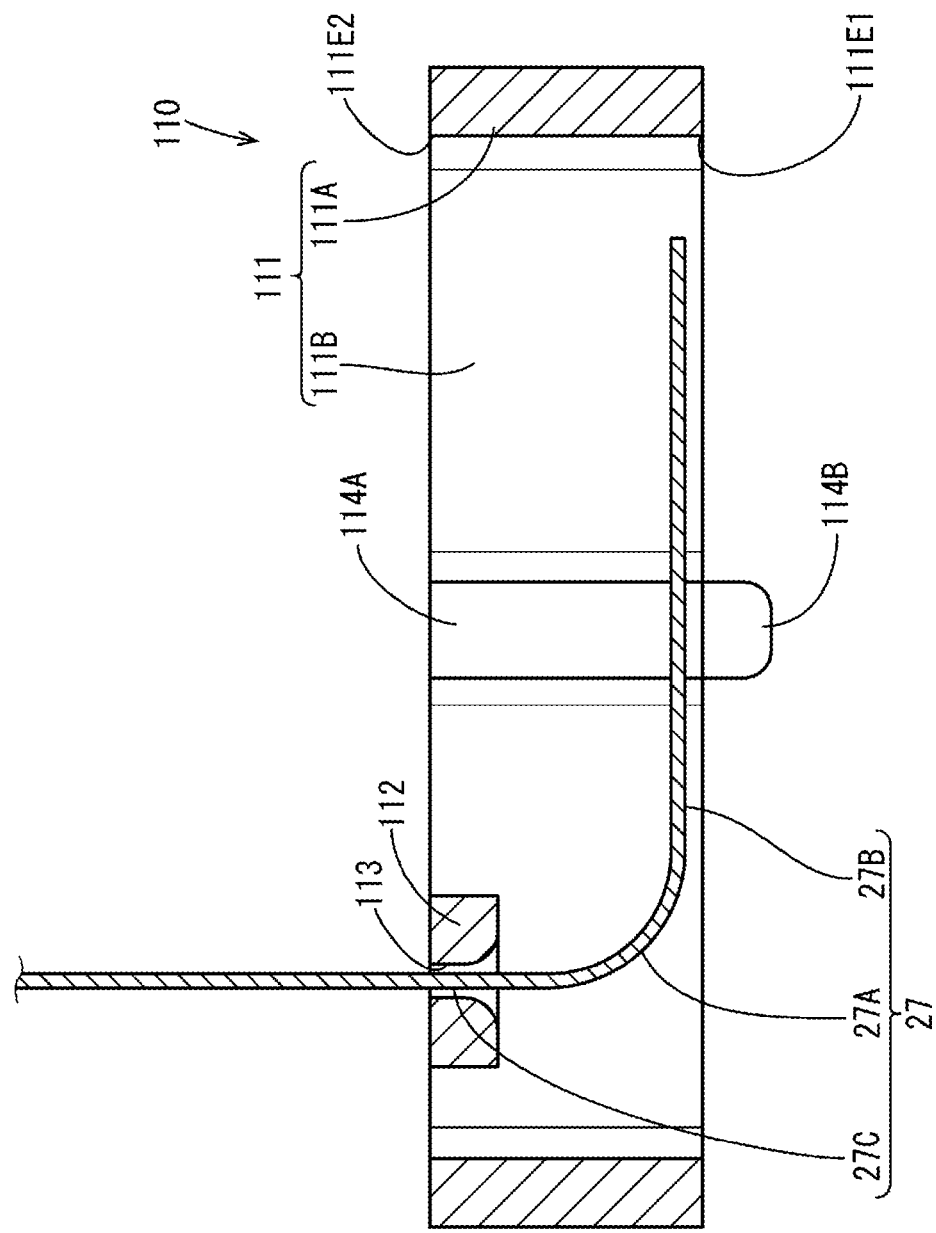
FIG. 12 is a partial enlarged cross-sectional view showing a frame member and a circuit connecting portion according to Reference example 2, which are cut at the same position as line B-B in FIG. 10.
Figure 13:
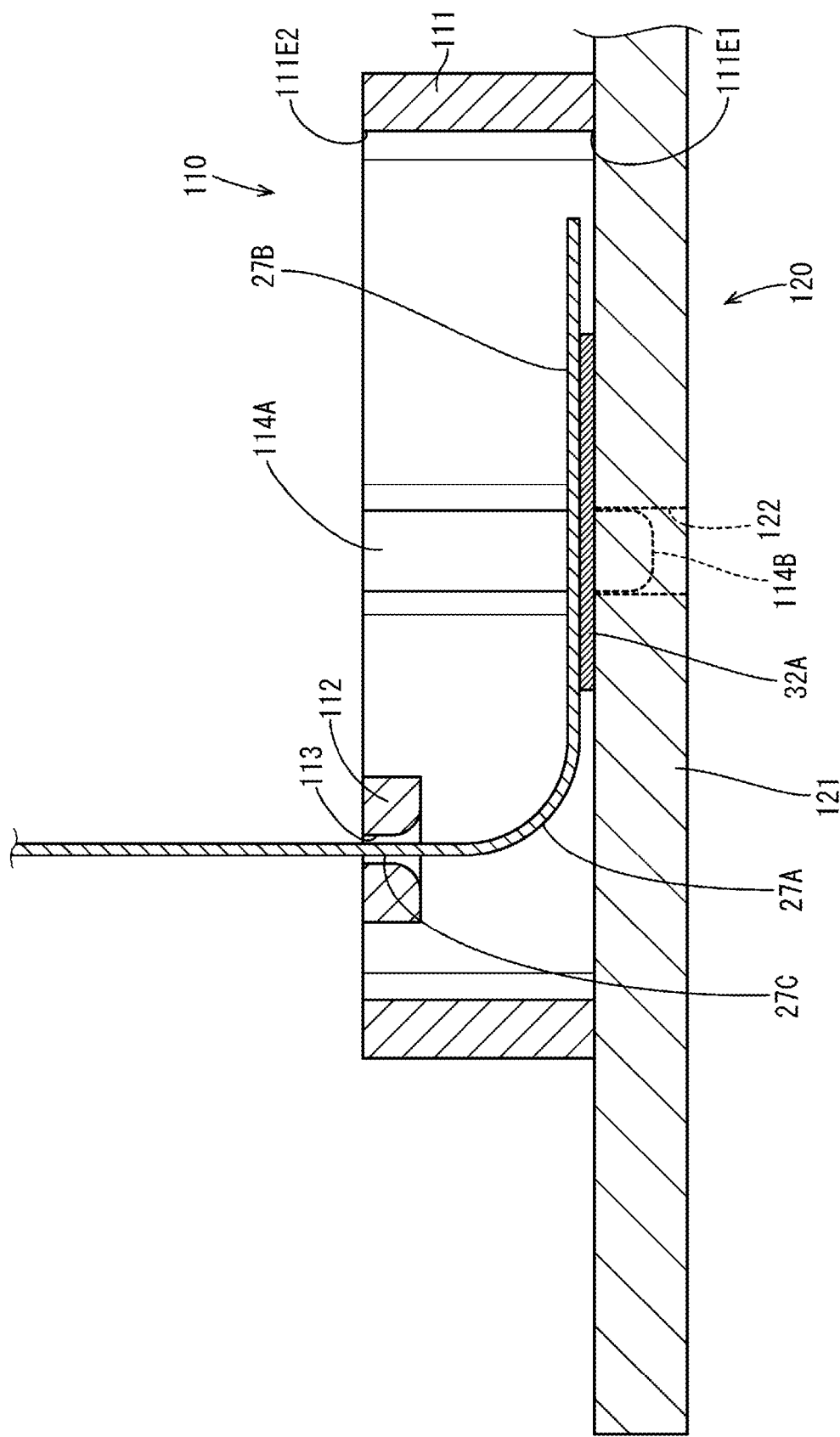
FIG. 13 is a partial enlarged cross-sectional view showing the frame member attached to a circuit board and the circuit connecting portion in Reference example 2, which are cut at the same position as line B-B in FIG. 10.

The surrounding portion 111 has a flat rectangular tube shape as shown in FIG. 9, and includes open ends 111E1 and 111E2 on opposite sides as shown in FIG. 12. As shown in FIG. 10, the surrounding portion 111 includes two first wall portions 111A and two second wall portions 111B. The two first wall portions 111A face each other. The two second wall portions 111B face each other and connect end portions of the two first wall portions 111A. As shown in FIGS. 11 and 13, one open end 111E1 of the surrounding portion 111 is in contact with the circuit board 120.

As shown in FIGS. 9 and 12, the holding portion 112 is formed as a plate perpendicular to both the first wall portions 111A and the second wall portions 111B and is located at the other open end 111E2 of the surrounding portion 111. As shown in FIG. 10, the holding portion 112 is in the vicinity of one of the pair of first wall portions 111A, and two ends of the holding portion 112 are connected to the pair of second wall portions 111B, respectively. As shown in FIGS. 9, 10, and 12, the holding portion 112 includes a slit 113 that extends through the holding portion 112 in its thickness direction and through which the circuit connecting portion 27 is passed. The slit 113 extends along the direction in which the holding portion 112 extends, i.e., extends in parallel with the first wall portions 111A.

The two fixed portions 114 are continuous to the two second wall portions 111B, respectively, as shown in FIG. 9, and each include a fixed base portion 114A and a fixed protrusion 114B as shown in FIG. 12. The fixed base portion 114A extends inward from the second wall portion 111B. The fixed protrusion 114B is a cylindrical protrusion extending from the open end 111E1 side end surface of the fixed portion 114.

Similarly to Reference example 1, the circuit board 120 includes an insulation plate 121 and the second conductive path 32 including the second land 32A. As shown in FIG. 13, the insulation plate 121 includes two fixing holes 122 that receive the fixed protrusions 114B. The two fixing holes 122 are formed at positions corresponding to the two fixed protrusions 114B, respectively.

As shown in FIG. 13, the frame member 110 is fixed to the circuit board 120 with the fixed protrusions 114B pressed into the respective fixing holes 122. The one open end 111E1 of the surrounding portion 111 is in contact with a surface of the circuit board 120 on which the second land 32A is provided. The surrounding portion 111 surrounds the second land 32A and the stacked portion 27B overlaid on the second land 32A. The base end portion 27C is passed through the slit 113 and thus kept at the position at which the base end portion 27C extends at an angle relative to the stacked portion 27B.

As shown in FIGS. 9 and 11, the covering portion 130 is inside the surrounding portion 111 and covers the stacked portion 27B and the second land 32A. Similarly to Reference example 1, the covering portion 130 is made of a resin material, such as a potting material, that has fluidity before being solidified and loses fluidity when solidified. Similarly to Reference example 1, the covering portion 130 covers the stacked portion 27B, the first land 23A, and surrounding regions of the stacked portion 27B and the first land 23A. In other words, the second land 32A and the stacked portion 27B including the first land 23A are entirely embedded in the covering portion 130.

[Steps for Connecting FPC 21A and Circuit Board 120]

The following describes an example of steps for connecting the FPC 21A and the circuit board 120. First, the bent portion 27A is formed by bending the circuit connecting portion 27 at a position slightly closer to the leading end thereof than the boundary position between the circuit connecting portion 27 and the connection base portion 26 is. Next, the base end portion 27C of the circuit connecting portion 27 is passed through the slit 113 as shown in FIG. 12.

Next, a step for connecting the first land 23A and the second land 32A with solder is performed. First, solder cream is applied to the second land 32A of the circuit board 120 through screen printing, for example. Next, as shown in FIG. 13, the frame member 110 is fixed to the circuit board 120 by pressing the fixed protrusions 114B into the fixing holes 122, respectively. In this state, the stacked portion 27B of the circuit connecting portion 27 is overlaid on the circuit board 120, and each first land 23A is positioned to be overlaid on the solder cream applied to the corresponding second land 32A. Also, the state where the base end portion 27C is raised to be substantially perpendicular to the stacked portion 27B is maintained so that the stacked portion 27B and the base end portion 27C form a substantially L shape. Next, reflow processing is performed. As a result, the first land 23A and the second land 32A are electrically connected to each other by the solder. Thus, the first land 23A and the second land 32A are connected.

Next, a step for forming the covering portion 130 is performed. First, a potting material having fluidity is dripped into the surrounding portion 111 using a nozzle or the like to fill the space inside the surrounding portion 111. At this time, the surrounding portion 111 keeps the potting material from flowing to the outside of a region in which the covering portion 130 is to be formed. Also, the holding portion 112 keeps the base end portion 27C in the state of being raised to be substantially perpendicular to the stacked portion 27B, and therefore, the dripped potting material can easily flow into the base end portion 27C side region (region on the lower left side of the bent portion 27A in FIG. 11) in the surrounding region of the stacked portion 27B. After dripping is finished, the potting material filling the space is cured to form the covering portion 130. Thus, the covering portion 130 is formed.

Functions and Effects

As described above, according to the present embodiment, the wiring module 100 includes the frame member 110 that is fixed to the circuit board 120 and includes the holding portion 112 holding the base end portion 27C. According to this configuration, the base end portion 27C is held by the holding portion 112, and accordingly, the state where the base end portion 27C is raised relative to the stacked portion 27B can be maintained during formation of the covering portion 130. Therefore, the covering portion 130 can be more easily formed over the entire circumference of the stacked portion 27B, and electrically connected portions between the FPC 21A and the circuit board 120 can be more reliably protected from water and dust.

Moreover, the frame member 110 includes the surrounding portion 111 surrounding the covering portion 130. According to this configuration, an outer edge of the covering portion 130 is defined by the surrounding portion 111, and accordingly, during formation of the covering portion 130, the material of the covering portion 130 can be kept from flowing to the outside of the region in which the covering portion 130 is to be formed, and the covering portion 130 can be stably formed in an intended shape. Therefore, the electrically connected portions between the FPC 21A and the circuit board 120 can be reliably protected from water and dust.

Embodiment 3

Figure 14:
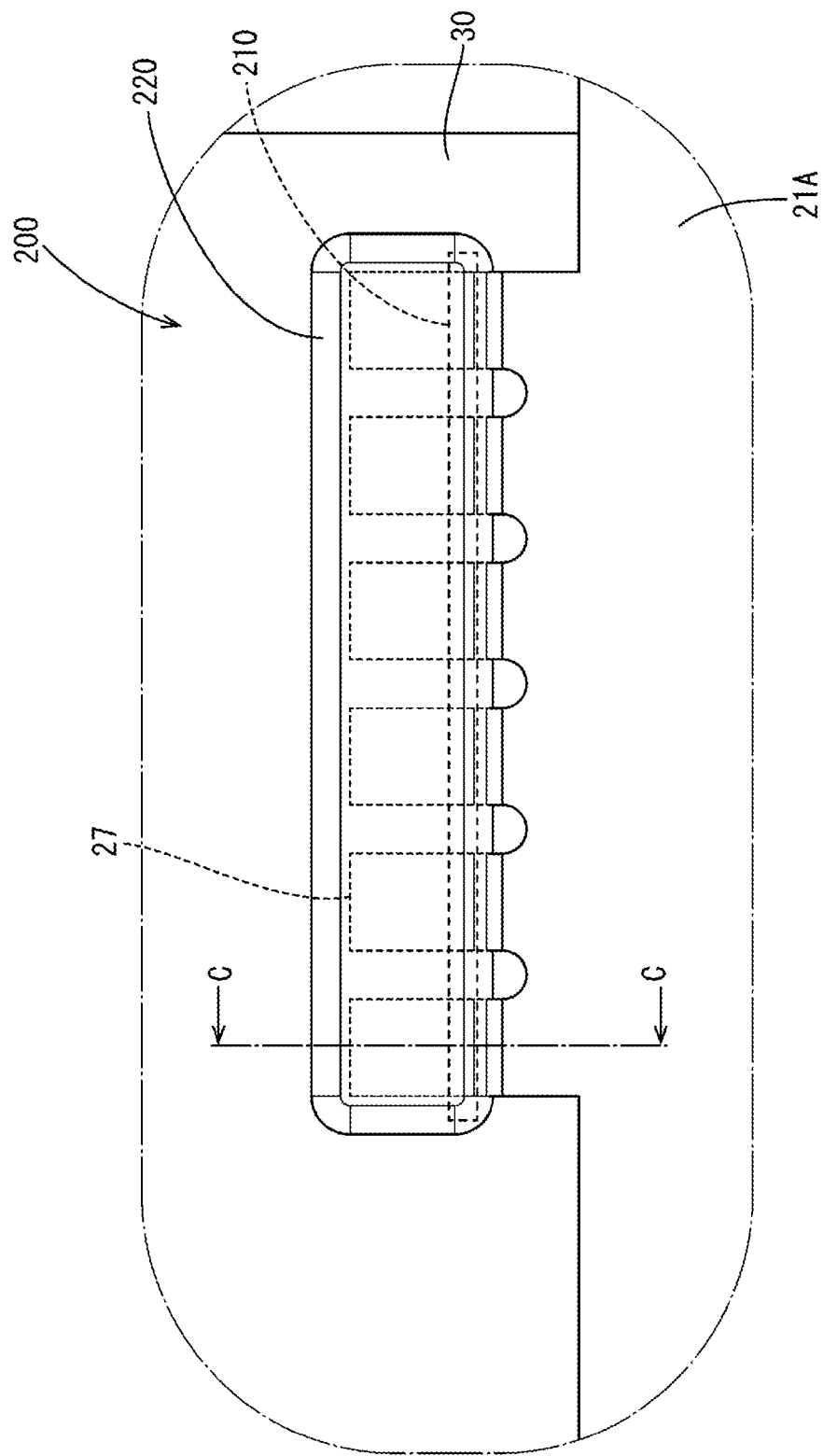
FIG. 14 is a partial enlarged bottom view of a wiring module according to Embodiment 3.

Next, Embodiment 3 will be described with reference to FIGS. 14 to 16. As shown in FIG. 14, a wiring module 200 according to the present embodiment differs from that in Reference example 1 in that the wiring module 200 includes an adhesive layer 210 that has adhesiveness and is interposed between the circuit connecting portion 27 and the circuit board 30. Configurations in the present embodiment that are equivalent to those in Reference example 1 are denoted with the same reference signs as those used in Reference example 1, and descriptions thereof are omitted.
[Configuration of Wiring Module 200]

The adhesive layer 210 in the present embodiment is constituted by a double sided tape. The double sided tape has a common structure including a substrate sheet made of a synthetic resin and adhesive layers that have adhesiveness and provided on both surfaces of the substrate sheet. As shown in FIG. 15, the adhesive layer 210 is arranged next to the second land 32A on the insulation plate 31 of the circuit board 30, and bonds the circuit board 30 and a portion of the stacked portion 27B. The adhesive layer 210 is adjacent to the bent portion 27A. That is, the portion of the stacked portion 27B that is bonded to the circuit board 30 via the adhesive layer 210 is an intermediate portion 27BM between the bent portion 27A and the first land 23A. As shown in FIG. 14, in the present embodiment, a plurality of second lands 32A are arranged in a line on the insulation plate 31 of the circuit board 30, and a band-shaped adhesive layer 210 that is longer than the row of the second lands 32A is provided adjacent to the row of second lands 32A. As described above, the single band-shaped adhesive layer 210 is shared by the plurality of second lands 32A, and therefore, work for arranging the adhesive layer 210 can be performed easily.

Figure 15:
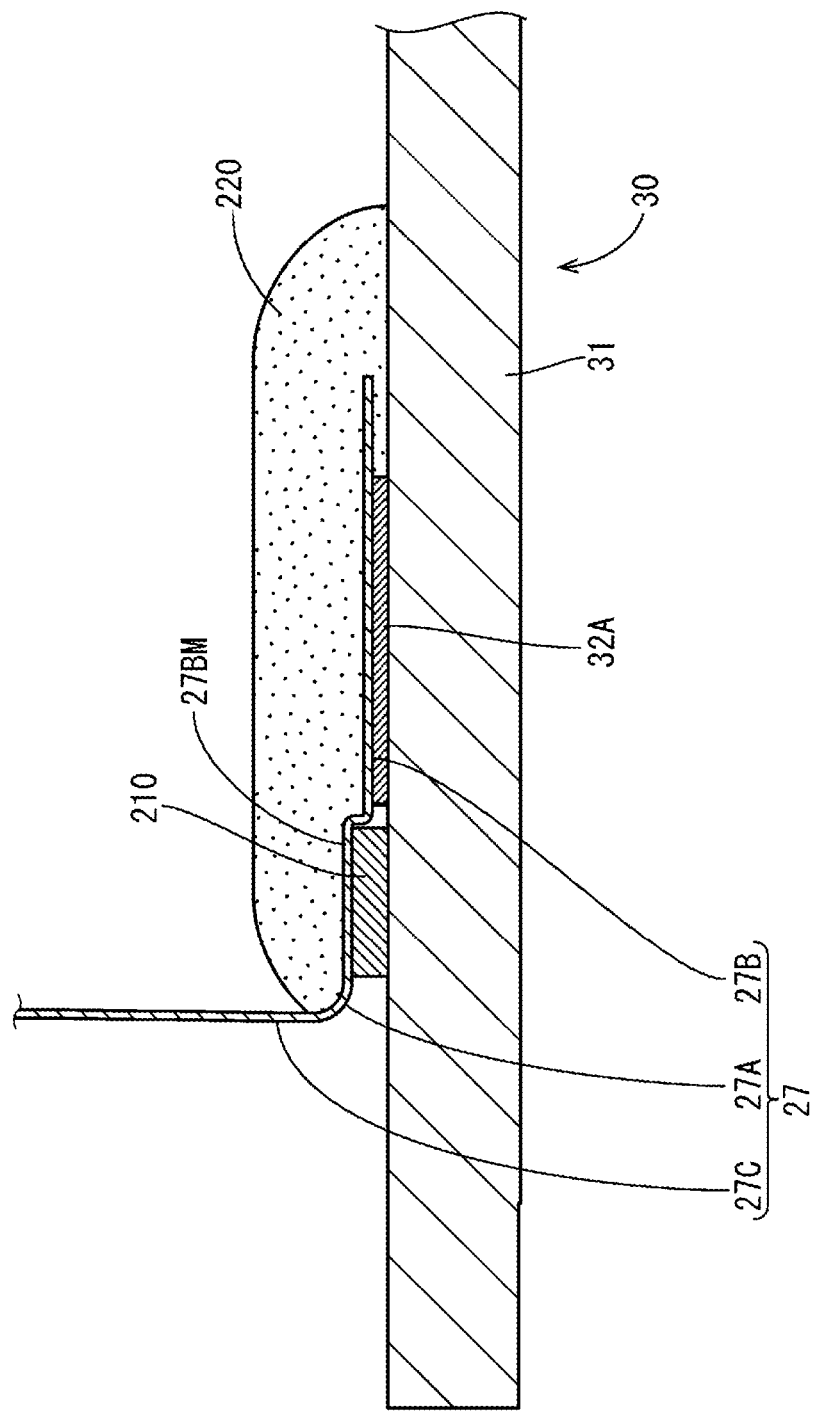
FIG. 15 is a cross-sectional view taken along line C-C in FIG. 14.
Figure 16:
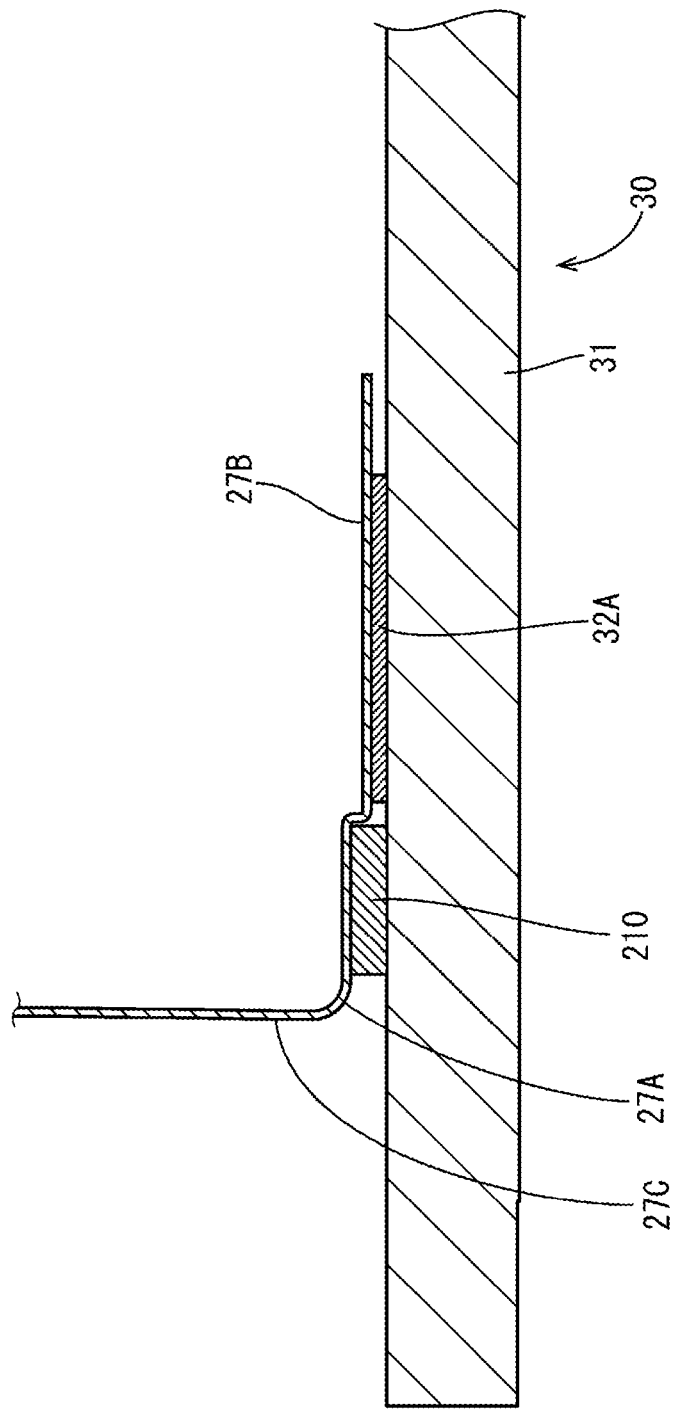
FIG. 16 is a partial enlarged cross-sectional view showing a state where a stacked portion is overlaid on a circuit board in Embodiment 3 in a cross section cut at the same position as line C-C in FIG. 14.

As shown in FIG. 15, the stacked portion 27B and the second land 32A are covered by a covering portion 220. The covering portion 220 has a dome-like external shape, and covers the stacked portion 27B and the first land 23A. The second land 32A and the first land 23A soldered to the second land 32A are entirely embedded in the covering portion 220. The bent portion 27A and a portion (left end portion in FIG. 15) of the stacked portion 27B that is adjacent to the bent portion 27A and overlaps the adhesive layer 210 may be exposed from the covering portion 220. As shown in FIG. 14, in the present embodiment as well, the single covering portion 220 collectively covers the plurality of second lands 32A arranged in a line and the stacked portions 27B of the plurality of circuit connecting portions 27 connected to the second lands 32A similarly to Reference example 1.
[Steps for Connecting FPC 21A and Circuit Board 30]

The following describes an example of steps for connecting the FPC 21A and the circuit board 30. First, the bent portion 27A is formed by bending the circuit connecting portion 27 at a position slightly closer to the leading end thereof than the boundary position between the circuit connecting portion 27 and the connection base portion 26 is. Also, a double sided tape is affixed to a position adjacent to the second lands 32A on the circuit board 30 to form the adhesive layer 210.

Next, a step for connecting the first land 23A and the second land 32A with solder is performed. First, solder cream is applied to the second land 32A of the circuit board 30 through screen printing, for example. Next, the stacked portion 27B of the circuit connecting portion 27 is overlaid on the circuit board 30 as shown in FIG. 16. At this time, each first land 23A is overlaid on the solder cream applied to the corresponding second land 32A. Also, the intermediate portion of the stacked portion 27B between the bent portion 27A and the first land 23A is overlaid on the adhesive layer 210, and thus the stacked portion 27B is temporarily fixed to the circuit board 30 in a state of being positioned relative to the circuit board 30. Next, reflow processing is performed. As a result, the first land 23A and the second land 32A are electrically connected to each other by the solder. Thus, the first land 23A and the second land 32A are connected.

Next, the covering portion 220 is formed. A potting material having fluidity is dripped onto the circuit board 30 using a nozzle or the like to be applied in a dome-like shape. After dripping is finished, the applied potting material is cured to form the covering portion 220. Thus, the covering portion 220 is formed.

Here, the adhesive layer 210 is provided between the insulation plate 31 of the circuit board 30 and the stacked portion 27B as described above. In particular, the adhesive layer 210 is adjacent to the bent portion 27A. Therefore, even if the dripped potting material is stopped by the base end portion 27C and does not sufficiently flow into the base end portion 27C side region (region on the lower left side of the bent portion 27A in FIG. 15) in the surrounding region of the stacked portion 27B, the adhesive layer 210 prevents water and dust from entering via this region. As described above, it is possible to reliably protect the stacked portion 27B and the first land 23A over the entire circumference thereof from water and dust by using the covering portion 220 and the adhesive layer 210 in combination.

[Functions and Effects]

As described above, according to the present embodiment, the wiring module 200 includes the adhesive layer 210 that has adhesiveness and is interposed between the circuit connecting portion 27 and the circuit board 30. According to this configuration, it is possible to more reliably protect the electrically connected portions between the FPC 21A and the circuit board 30 from water and dust by bonding the circuit connecting portion 27 to the circuit board 30 with use of the adhesive layer 210 and covering the electrically connected portions with the covering portion 220. Also, the circuit connecting portion 27 can be temporarily fixed to the circuit board 30 in the state of being positioned relative to the circuit board 30 with use of the adhesive layer 210 before the covering portion 220 is formed. This facilitates the work for forming the covering portion 220.

Also, the adhesive layer 210 between the stacked portion 27B and the circuit board 30 is adjacent to the bent portion 27A. According to this configuration, even if the material of the covering portion 220 is stopped by the base end portion 27C during formation of the covering portion 220 and does not sufficiently flow into the base end portion 27C side region in the surrounding region of the stacked portion 27B, the adhesive layer 210 prevents water and dust from entering via this region. Therefore, the electrically connected portions between the FPC 21A and the circuit board 30 can be further reliably protected from water and dust.

[Variation]

Figure 17:
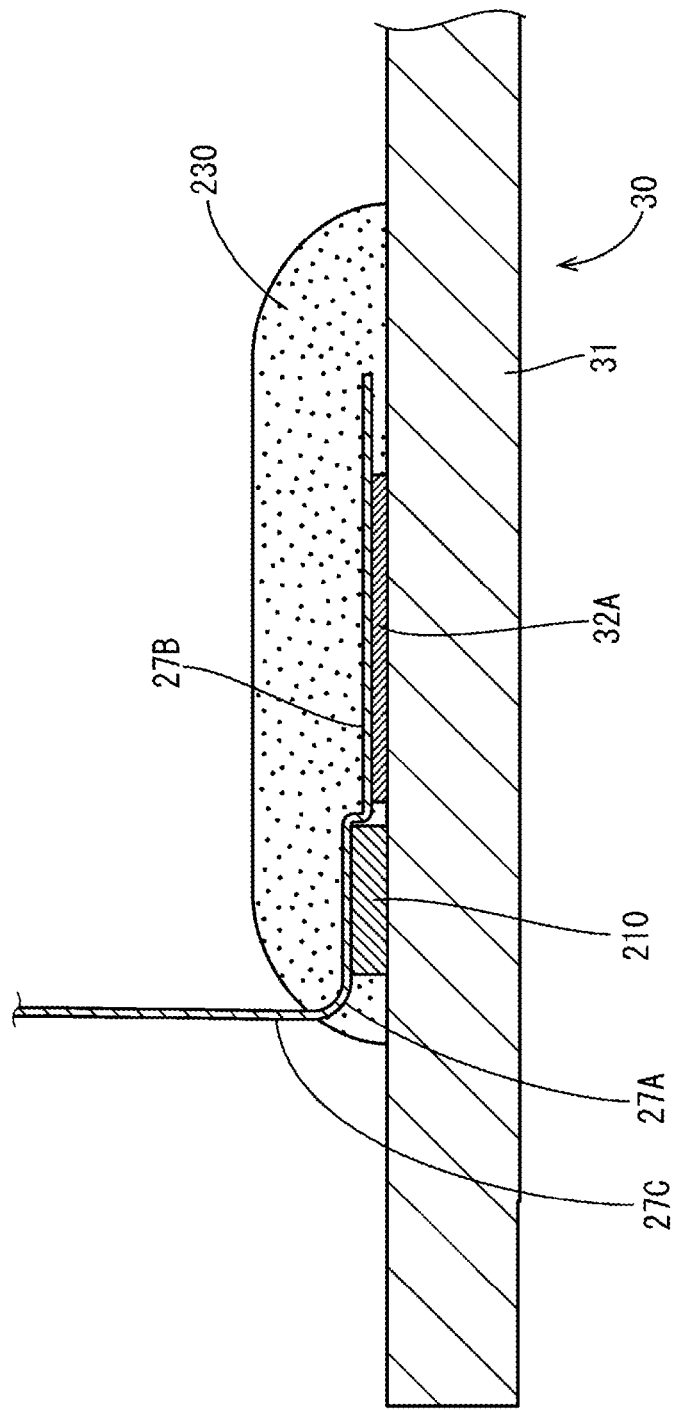
FIG. 17 is a partial enlarged cross-sectional view showing a wiring module according to a variation, which is cut at the same position as line C-C in FIG. 14.

As shown in FIG. 17, even in the case where the adhesive layer 210 is also used, it is preferable that the entirety of the stacked portion 27B, the bent portion 27A, and the first land 23A are covered by a covering portion 230 over the entire circumference thereof.

Other Embodiments (1) In the above embodiments, the circuit boards 30 and 120 are substrates that are not flexible, but the circuit boards may be flexible substrates.

(2) In the above embodiments, the two FPCs 21A and 21B are connected to the circuit board 30 or 120, but the number of flexible substrates connected to the circuit board may be one or three or more.

(3) In the above embodiments, the single covering portion 60 or 220 collectively covers the plurality of second lands 32A arranged in a line and the stacked portions 27B of the plurality of circuit connecting portions 27 connected to the second lands 32A, but pairs of the second lands and the circuit connecting portions connected to the second lands may be individually covered by covering portions.

(4) In Reference example 2, the frame member 110 includes the surrounding portion 111 surrounding the entire circumference of the covering portion 130 and the holding portion 112 that is continuous to the surrounding portion 111 and holds the circuit connecting portion 27, but the surrounding member surrounding the covering portion and the holding member holding the circuit connecting portion may be separate from each other, for example. Alternatively, a configuration is also possible in which the vehicle wiring module includes either one of the surrounding member and the holding member.

(5) In the above embodiments, the circuit connecting portion 27 includes the bent portion 27A, but particularly in the case where the adhesive layer is provided between the stacked portion and the circuit board as in Embodiment 3, a configuration is also possible in which the circuit connecting portion does not include the bent portion.

(6) In Embodiment 3, the adhesive layer 210 is constituted by a double sided tape, but the adhesive layer may also be constituted by an adhesive agent applied to the circuit board, for example.

(7) In Embodiment 3, the single band-shaped adhesive layer 210 is shared by the plurality of second lands 32A, but a configuration is also possible in which adhesive layers are individually arranged in correspondence with pairs of the second lands and the circuit connecting portions connected to the second lands.

LIST OF REFERENCE NUMERALS

1 Vehicle
2 Power storage module
3 PCU
4 Wire harness
10 Power storage element
11A, 11B Electrode terminal
20, 100, 200 Vehicle wiring module
21A, 21B FPC (flexible printed circuit board)
22 Insulation layer
23 First conductive path
23A First land
24 Main body portion
25 Wiring portion
26 Connection base portion
27 Circuit connecting portion
27A Bent portion
27B Stacked portion
27C Base end portion
30, 120 Circuit board
31 Insulation plate
32 Second conductive path
32A Second land
40 Bus bar (conductive member)
41 Electrode insertion hole
50 Relay member
60, 130, 220, 230 Covering portion
110 Frame member (holding member, surrounding member)
111 Surrounding portion
111A First wall portion
111B Second wall portion
111E1, 111E2 Open end
112 Holding portion
113 Slit
114 Fixed portion
114A Fixed base portion
114B Fixed protrusion
120 Circuit board
121 Insulation plate
122 Fixing hole
210 Adhesive layer
C Connector
E Electronic component

The invention claimed is:

1. A substrate connection structure comprising:
at least one flexible substrate that includes a first conductive path and has flexibility;
a circuit board including a second conductive path that is electrically connected to the first conductive path, wherein the flexible substrate includes a main body portion, a circuit connecting portion that extends from the main body portion and is overlaid on the circuit board; and an adhesive layer having adhesiveness and interposed between the circuit connecting portion and the circuit board, wherein the first conductive path includes a first land included in the circuit connecting portion, the second conductive path includes a second land that is connected to the first land, a connected portion between the first land and the second land is covered by a covering portion that is constituted by a resin having an insulating property, the circuit connecting portion includes:
- a stacked portion that is overlaid on the circuit board;
- a base end portion that is an intermediate portion between the stacked portion and a boundary position between the circuit connecting portion and the main body portion; and
- a bent portion that is bent at a boundary position between the base end portion and the stacked portion, and the adhesive layer is provided between the stacked portion and the circuit board and is adjacent to the bent portion, and an intermediate portion of the stacked portion between the bent portion and the first land is bonded to the circuit board via the adhesive layer.

2. The substrate connection structure according to claim 1, further comprising a holding member that is fixed to the circuit board and holds the base end portion.

3. The substrate connection structure according to claim 1, further comprising a surrounding member that is fixed to the circuit board and surrounds the covering portion.

4. The substrate connection structure according to claim 1, wherein an entire circumference of the connected portion between the first land and the second land is covered by the covering portion.

5. A vehicle wiring module that is included in a power storage module including a plurality of power storage elements having electrode terminals and is connected to the power storage elements, the vehicle wiring module comprising:

a conductive member that is connected to the electrode terminals;

at least one flexible substrate that has flexibility and includes a first conductive path that is electrically connected to the conductive member;

a circuit board including a second conductive path that is electrically connected to the first conductive path, wherein the flexible substrate includes a main body portion and a circuit connecting portion that extends from the main body portion and is overlaid on the circuit board; and an adhesive layer having adhesiveness and interposed between the circuit connecting portion and the circuit board, wherein the first conductive path includes a first land included in the circuit connecting portion, the second conductive path includes a second land that is connected to the first land, a connected portion between the first land and the second land is covered by a covering portion that is constituted by a resin having an insulating property, the circuit connecting portion includes:
- a stacked portion that is overlaid on the circuit board;
- a base end portion that is an intermediate portion between the stacked portion and a boundary position between the circuit connecting portion and the main body portion; and
- a bent portion that is bent at a boundary position between the base end portion and the stacked portion, and the adhesive layer is provided between the stacked portion and the circuit board and is adjacent to the bent portion, and an intermediate portion of the stacked portion between the bent portion and the first land is bonded to the circuit board via the adhesive layer.

* * * * *